US012787414B2

(12) United States Patent
Xiang et al.

(10) Patent No.: US 12,787,414 B2
(45) Date of Patent: Nov. 3, 2026

(54) HEMT DEVICES AND MANUFACTURING METHODS THEREOF

(71) Applicant: ENKRIS SEMICONDUCTOR, INC., Suzhou (CN)

(72) Inventors: Peng Xiang, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 428 days.

(21) Appl. No.: 18/681,636

(22) PCT Filed: Nov. 5, 2021

(86) PCT No.: PCT/CN2021/129104
§ 371 (c)(1),
(2) Date: Feb. 6, 2024

(87) PCT Pub. No.: WO2023/077461
PCT Pub. Date: May 11, 2023

(65) Prior Publication Data
US 2025/0227981 A1 Jul. 10, 2025

(51) Int. Cl.
*H10D 64/64* (2025.01)
*H10D 30/01* (2025.01)
(Continued)

(52) U.S. Cl.
CPC ........... *H10D 64/64* (2025.01); *H10D 30/015* (2025.01); *H10D 30/475* (2025.01); *H10D 62/8503* (2025.01); *H10D 64/01* (2025.01)

(58) Field of Classification Search
CPC ...... H10D 64/64; H10D 64/01; H10D 30/015; H10D 30/475; H10D 30/01; H10D 30/47; H10D 62/8503; H10D 48/30; H10D 84/05
See application file for complete search history.

(56) References Cited

U.S. PATENT DOCUMENTS 8,890,206 B2 * 11/2014 Yamada ............... H10D 30/015 257/190
10,529,821 B2 * 1/2020 Huang .................... C30B 25/04
(Continued)

FOREIGN PATENT DOCUMENTS

CN 102856355 A 1/2013
CN 103035696 A 4/2013
(Continued)

OTHER PUBLICATIONS

ISA State Intellectual Property Office of the People's Republic of China, International Search Report Issued in Application No. PCT/CN2021/129104, Jul. 21, 2022, WIPO, 4 pages.
(Continued)

*Primary Examiner* — Dao H Nguyen
(74) *Attorney, Agent, or Firm* — Carroll, Hoette & Butscher, LLC; Christopher R. Carroll

(57) ABSTRACT

The present disclosure provides a HEMT device and a manufacturing method thereof. The HEMT device includes: a substrate, a heterojunction structure, a P-type semiconductor layer, a first stress layer and/or a second stress layer, a gate, a source and a drain, where the first stress layer is located on the opposite sidewalls of the P-type semiconductor layer, and is configured to apply compressive stress to the P-type semiconductor layer in the direction parallel to the plane where the substrate is located, and to apply tensile stress to the P-type semiconductor layer in the direction perpendicular to the plane where the substrate is located. The second stress layer is located on the top wall of the P-type semiconductor layer, and is configured to apply compressive stress to the P-type semiconductor layer in the direction parallel to the plane where the substrate is located.

20 Claims, 9 Drawing Sheets

(51) Int. Cl.

| | |
|---|---|
| ***H10D 30/47*** | (2025.01) |
| ***H10D 62/85*** | (2025.01) |
| ***H10D 64/01*** | (2025.01) |

(56) References Cited

U.S. PATENT DOCUMENTS

| | | | | |
|---|---|---|---|---|
| 11,335,797 | B2 * | 5/2022 | Chen .................... | H10D 30/015 |
| 11,749,740 | B2 * | 9/2023 | Chen .................... | H10D 30/015 257/192 |
| 12,094,962 | B2 * | 9/2024 | Liu ...................... | H10D 30/015 |
| 2017/0133362 | A1 | 5/2017 | Barlow | |
| 2021/0351287 | A1 | 11/2021 | Chen et al. | |
| 2023/0031437 | A1 * | 2/2023 | Chen .................... | H10D 30/472 |
| 2024/0047567 | A1 * | 2/2024 | Hao ..................... | H10D 30/472 |

FOREIGN PATENT DOCUMENTS

| | | | |
|---|---|---|---|
| CN | 103855024 | A | 6/2014 |
| CN | 103855025 | A | 6/2014 |
| CN | 104795333 | A | 7/2015 |
| CN | 110061053 | A | 7/2019 |
| CN | 109585545 | B | 11/2020 |
| CN | 111933709 | A | 11/2020 |
| WO | 2018036413 | A1 | 3/2018 |

OTHER PUBLICATIONS

ISA State Intellectual Property Office of the People's Republic of China, Written Opinion of the International Searching Authority Issued in Application No. PCT/CN2021/129104, Jul. 21, 2022, WIPO, 5 pages.(Submitted with Machine/Partial Translation).

* cited by examiner

HEMT DEVICES AND MANUFACTURING METHODS THEREOF

CROSS REFERENCE TO RELATED APPLICATIONS

This application is a US National Phase of a PCT Application No. PCT/CN2021/129104 filed on Nov. 5, 2021, the entire contents of which are incorporated herein by reference in their entireties.

TECHNICAL FIELD

The present disclosure relates to the technical field of semiconductors, and in particular, to HEMT devices and manufacturing methods thereof.

BACKGROUND

Gallium nitride (GaN), as a representative of the third generation of wide band gap semiconductor, is attracting widespread attention. Superior properties of GaN mainly include: high electron mobility and high two-dimensional electron gas (2DEG) concentration. In addition. GaN materials are chemically stable, high temperature resistant and corrosion resistant, and have inherent advantages in high frequency, high power and radiation resistant applications.

High electron mobility transistors (HEMTs) based on AlGaN/GaN heterojunction have been widely used in the semiconductor field. These devices have the properties of high reverse blocking voltage, low forward conduction resistance, and high operating frequency, and thus can meet the requirements of a system for semiconductor devices to operate at higher power, higher frequency and smaller volume.

HEMT devices generally use a P-type semiconductor layer to deplete the two-dimensional electron gas below the gate in order to achieve a constant turn-off device. However, conventional P-type ions, such as doped Mg ions, have an activation efficiency of only about 2% after activation, thus a high concentration of doped Mg (>1e19 $cm^{-3}$) is required to achieve a P-type semiconductor layer. In addition, doped Mg ions have a self-compensation effect, and if the Mg doping concentration continues to increase, the hole concentration of the P-type semiconductor layer will decrease instead. Therefore, the hole concentration of Mg-doped P-type semiconductor layer is generally in the order of $10^{17}$ $cm^{-3}$, which is very low:

To solve the above problem, the thickness of the P-type semiconductor layer needs to be increased to provide a greater hole concentration to deplete the two-dimensional electron gas below the gate to achieve a constant turn-off device. However, if the thickness of the P-type semiconductor layer is too large, the ability of the gate to control the channel will be reduced, and the performance of the device will be deteriorated.

SUMMARY

The object of the present disclosure is to provide a HEMT device and manufacturing methods thereof.

To achieve the above purpose, a first aspect of the present disclosure provides a HEMT device including:

a substrate:

a heterojunction structure on the substrate, where the heterojunction structure includes a gate region, and a source region and a drain region located on both sides of the gate region:

a P-type semiconductor layer on the gate region:

at least one of a first stress layer or a second stress layer, where the first stress layer is located on two opposite sidewalls of the P-type semiconductor layer for applying a compressive stress to the P-type semiconductor layer in a direction parallel to a plane in which the substrate is located and a tensile stress to the P-type semiconductor layer in a direction perpendicular to the plane in which the substrate is located; and the second stress layer is located on a top wall of the P-type semiconductor layer for applying a compressive stress to the P-type semiconductor layer in a direction parallel to the plane in which the substrate is located; and a gate, a source and a drain, where the gate is connected to the P-type semiconductor layer, the source is located on the source region and the drain is located on the drain region.

In some examples, a material of at least one of the first stress layer or the second stress layer is silicon nitride, diamond-like carbon or P-type diamond-like carbon.

In some examples, the P-type semiconductor layer includes a first sidewall close to the source region and a second sidewall close to the drain region, and the first stress layer is located on the first sidewall and the second sidewall of the P-type semiconductor layer.

In some examples, the first stress layer fills up or does not fill up at least one of: a gap between the P-type semiconductor layer and the source, or a gap between the P-type semiconductor layer and the drain.

In some examples, the first stress layer covers on the source, the heterojunction structure between the source and the gate, the gate, the heterojunction structure between the gate and the drain, and the drain.

In some examples, the first stress layer between the source and the gate includes a first opening for exposing the heterojunction structure, a first GaN-based epitaxial layer is located in the first opening, and the first GaN-based epitaxial layer applies a compressive stress to the P-type semiconductor layer in a direction parallel to the plane in which the substrate is located and a tensile stress to the P-type semiconductor layer in a direction perpendicular to the plane in which the substrate is located; and the first stress layer between the drain and the gate includes a second opening for exposing the heterojunction structure, a second GaN-based epitaxial layer is in the second opening, and the second GaN-based epitaxial layer applies a compressive stress to the P-type semiconductor layer in a direction parallel to the plane in which the substrate is located and a tensile stress to the P-type semiconductor layer in a direction perpendicular to the plane in which the substrate is located.

In some examples, materials of the first GaN-based epitaxial layer and the second GaN-based epitaxial layer is InGaN.

In some examples, the heterojunction structure includes a channel layer close to the substrate and a barrier layer away from the substrate, and the source and the drain contact the channel layer or the barrier layer.

In some examples, the substrate includes a compressive stress layer between the substrate and the heterojunction structure for applying a compressive stress to the P-type semiconductor layer in a direction parallel to the plane in which the substrate is located.

In some examples, a material of the compressive stress layer is $Al_xIn_yGa_{1-x-y}N$.

In some examples, the second stress layer includes a third opening for exposing the P-type semiconductor layer, and the gate is located in the third opening and on the second stress laver.

In some examples, the P-type semiconductor layer includes a cross-section parallel to the plane in which the substrate is located; and at least one of: the first sidewall of the P-type semiconductor layer includes a wavy, curved or zigzag cross-section, or the second sidewall of the P-type semiconductor layer has a wavy, curved or zigzag cross-section.

A second aspect of the present disclosure provides a manufacturing method of a HEMT device including.

providing a substrate: providing a heterojunction structure on the substrate, where the heterojunction structure includes a gate region, and a source region and a drain region on both sides of the gate region:

forming a P-type semiconductor layer on the gate region; forming at least one of a first stress layer on two opposite sidewalls of the P-type semiconductor layer or a second stress layer on a top wall of the P-type semiconductor layer, where the first stress layer is configured to apply a compressive stress to the P-type semiconductor layer in a direction parallel to a plane in which the substrate is located and a tensile stress to the P-type semiconductor layer in a direction perpendicular to the plane in which the substrate is located, and the second stress layer is configured to apply a compressive stress to the P-type semiconductor layer in a direction parallel to a plane in which the substrate is located; and forming a gate, a source and a drain respectively, where the gate is connected to the P-type semiconductor layer, the source is located on the source region and the drain is located on the drain region.

In some examples, a plurality of gate regions are connected together, a plurality of source regions are connected together, a plurality of drain regions are connected together, and a plurality of P-type semiconductor layers are connected together: each of the P-type semiconductor layers including a first sidewall close to a source region and a second sidewall close to a drain region and the first stress layer is formed on the first sidewall and the second sidewall of the P-type semiconductor layer In some examples, after the forming the gate, the source and the drain, the manufacturing method further includes: cutting the substrate, the heterojunction structure, the gate regions connected together, the source regions connected together, the drain regions connected together, the P-type semiconductor layers connected together and the first stress layers to form a plurality of the HEMT devices.

In some examples, forming the first stress layer includes:

first forming the gate the source and the drain and then forming the first stress layer on the source the heterojunction structure between the source and the gate, the gate, the heterojunction structure between the gate and the drain, and the drain: or first forming the first stress layer on a top wall of the P-type semiconductor layer, sidewalls of the P-type semiconductor layer and the heterojunction structure, then removing the first stress layer on regions other than the sidewalls of the P-type semiconductor layer, and then forming the gate, the source and the drain respectively.

In some examples, after forming the first stress layer, the manufacturing method further includes; forming a first opening for exposing the heterojunction structure within the first stress layer between the source and the gate; epitaxially growing a first GaN-based epitaxial layer in the first opening, where the first GaN-based epitaxial layer applies a compressive stress to the P-type semiconductor layer in a direction parallel to the plane in which the substrate is located and a tensile stress to the P-type semiconductor layer in a direction perpendicular to the plane in which the substrate is located; forming a second opening for exposing the heterojunction structure within the first stress layer between the drain and the gate; and epitaxially growing a second GaN-based epitaxial layer in the second opening, where the second GaN-based epitaxial layer applies a compressive stress to the P-type semiconductor layer in a direction parallel to the plane in which the substrate is located and a tensile stress to the P-type semiconductor layer in a direction perpendicular to the plane in which the substrate is located.

In some examples, forming the gate including; forming a second stress layer on a top wall of the P-type semiconductor layer for applying a compressive stress to the P-type semiconductor layer in a direction parallel to the plane in which the substrate is located; forming a third opening for exposing the P-type semiconductor layer in the second stress layer; and forming the gate in the third opening and on the second stress layer.

In some examples, the first stress layer is first epitaxially grown on the two opposite sides of the P-type semiconductor layer, and the second stress layer is later epitaxially grown on the top wall of the P-type semiconductor layer, and epitaxial growth process parameters of the second stress layer are different from epitaxial growth process parameters of the first stress layer.

In some examples, the first stress layer and the second stress layer that are epitaxially grown are connected together or separated from each other.

In some examples, forming the P-type semiconductor layer on the gate region includes:

forming an ion doped layer on the heterojunction structure, activating doped ions in an entire surface of the ion doped layer to form a P-type semiconductor layer, and removing the P-type semiconductor layer other than the gate region by etching; or forming an ion doped layer on an entire surface of the heterojunction structure, providing a patterned mask layer on the ion doped layer, where the patterned mask layer includes a window to expose the gate region; and activating doped ions in the ion doped layer on the gate region to form the P-type semiconductor layer.

Figure 1:
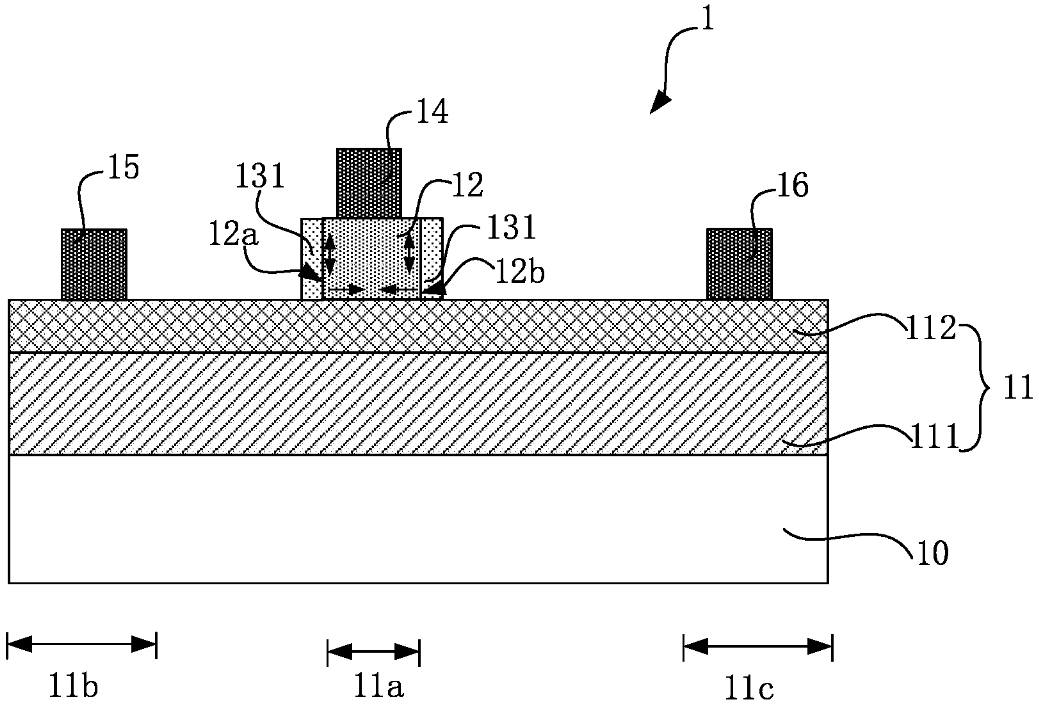
FIG. 1 is a schematic cross-sectional structure diagram of a HEMT device according to a first embodiment of the present disclosure.

For the convenience of understanding the present disclosure, all reference numerals appearing in the present disclosure are listed below.

| | |
|---|---|
| HEMT devices | 1, 2, 3, 4, 5, 6, 7, 8 |
| substrate | 10 |
| heterojunction structure | 11 |
| gate region | 11a |
| source region | 11b |
| drain region | 11c |
| P-type semiconductor layer | 12 |
| first sidewall | 12a |
| second sidewall | 12b |
| first stress layer | 131 |
| gate | 14 |
| source | 15 |
| drain | 16 |
| channel layer | 111 |
| barrier layer | 112 |
| ion doped layer | 12' |
| patterned mask layer | 20 |
| window | 20a |
| first GaN-based epitaxial layer | 17 |
| second GaN-based epitaxial layer | 18 |
| second stress layer | 132 |
| third opening | 132a |
| compressive stress layer | 19 |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a schematic diagram of the cross-sectional structure of the HEMT device according to the first embodiment of the present disclosure.

Referring to FIG. 1, the HEMT device 1 includes:

a substrate 10;

a heterojunction structure 11 on the substrate 10; the heterojunction structure 11 includes a gate region 11*a*, and a source region 11*b* and a drain region 11*c* on both sides of the gate region 11*a;* a P-type semiconductor layer 12 on the gate region 11*a;* a first stress layer 131 on two opposite sidewalls of the P-type semiconductor layer 12, where the first stress layer 131 is configured to apply a compressive stress to the P-type semiconductor layer 12 in a direction parallel to a plane in which the substrate 10 is located and a tensile stress to the P-type semiconductor layer 12 in a direction perpendicular to the plane in which the substrate 10 is located; and a gate 14, a source 15 and a drain 16, where the gate 14 is on the P-type semiconductor layer 12, the source 15 is on the source region 11*b*, and the drain 16 is on the drain region 11*c*.

A material of the substrate 10 may include sapphire, silicon carbide, silicon, or diamond.

Referring to FIG. 1, the heterojunction structure 11 includes a channel layer 111 close to the substrate 10 and a barrier layer 112 away from the substrate 10. An interface between the channel layer 111 and the barrier layer 112 may form two-dimensional electron gas.

Materials of both the channel layer 111 and the barrier layer 112 may be GaN-based materials, and a band gap of the barrier layer 112 is greater than a band gap of the channel layer 111. The material of the barrier layer 112 may be AlGaN, and the material of the channel layer 111 may be GaN.

The material of the P-type semiconductor layer 12 may be a GaN-based material, and the P-type doping element can include at least one of Mg. Zn, Ca, Sr or Ba. The P-type doping element, when activated, can provide holes that consume excess two-dimensional electron gas at the interface of the heterojunction structure 11, to form an enhanced device.

In this embodiment, the P-type semiconductor layer 12 includes a first sidewall 12*a* close to the source region 11*b* and a second sidewall 12*b* close to the drain region 11*c*.

The first stress layer 131 is located on the first sidewall 12*a* and the second sidewall 12*b*, and a material of the first stress layer 131 can be silicon nitride, diamond-like carbon (DLC) or P-type diamond-like carbon (PDLC).

Taking silicon nitride as an example for the material of the first stress layer 131, by controlling the silicon nitride film to have more free elemental nitrogen or elemental silicon, the silicon nitride film exhibits intrinsic compressive stress, which in turn can apply tensile stress to the P-type semiconductor layer 12 in the direction perpendicular to the plane in which the substrate 10 is located, so that the P-type semiconductor layer 12 is compressively stressed in the direction parallel to the plane in which the substrate 10 is located. This is because: the molecules of the silicon nitride film near the cavities or defects inside the silicon nitride film maintain the shape of the silicon nitride film by mutual gravitational force, and when the free elemental nitrogen or elemental silicon monomers fill the cavities inside the silicon nitride film, the free elemental nitrogen or elemental silicon atoms/molecules will produce compressive stress on the silicon nitride film around the cavities, and thus the silicon nitride film exhibits intrinsic compressive stress.

Diamond-like carbon (DLC) and P-type diamond-like carbon (PDLC) apply stress on the P-type semiconductor layer 12 in a similar principle to that of the silicon nitride film.

The P-type semiconductor layer 12 is subjected to a compressive stress in the direction parallel to the plane in which the substrate 10 is located and a tensile stress in the direction perpendicular to the plane in which the substrate 10 is located, such that a) valence band of the GaN-based material splits, to increase activity of holes; and/or b) an equivalent mass of holes decreases, to increase migration rate. Both the benefits a) and b) can increase the equivalent hole concentration within the P-type semiconductor layer 12.

Referring to FIG. 1, in this embodiment, the first stress layer 131 neither fills up a gap between the P-type semiconductor layer 12 and the source 15, nor fills up a gap between the P-type semiconductor layer 12 and the drain 16. A gap between the first stress layer 131 and the source 15, and a gap between the first stress layer 131 and the drain 16 may be provided with a passivation layer. A thickness of the passivation layer may be less than a thickness of the P-type semiconductor layer 12.

Materials of the gate 14, the source 15 and the drain 16 may be metals, such as Ti/Al/Ni/Au, Ni/Au, etc. Schottky contact may be formed between the gate 14 and the P-type semiconductor layer 12, and ohmic contact may be formed between the source 15 and the source region 11*b*, and between the drain 16 and the drain region 11*c*.

Side walls of the gate 14 may be aligned with side walls of the P-type semiconductor layer 12, or the gate 14 may be slightly narrower than the P-type semiconductor layer 12.

Figure 2:
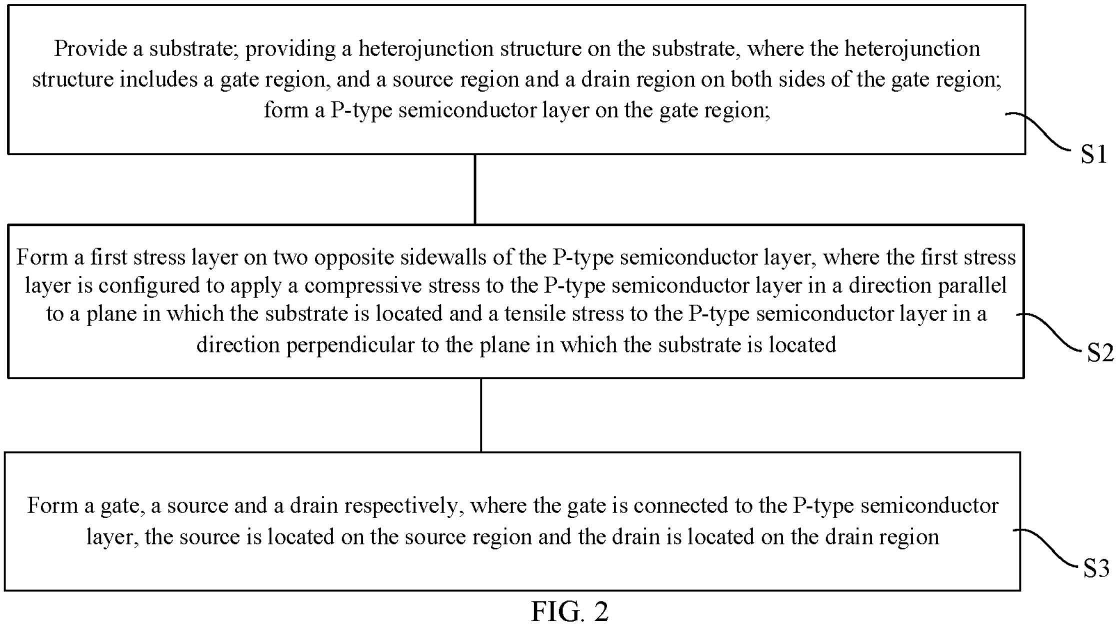
FIG. 2 is a flowchart of a manufacturing method of the HEMT device in FIG. 1.

The first embodiment of the present disclosure also provides a manufacturing method for the HEMT device in FIG. 1. FIG. 2 is a flow chart of the manufacturing method; and FIGS. 3 to 11 are schematic diagrams of intermediate structures corresponding to the process in FIG. 2.

Figure 3:
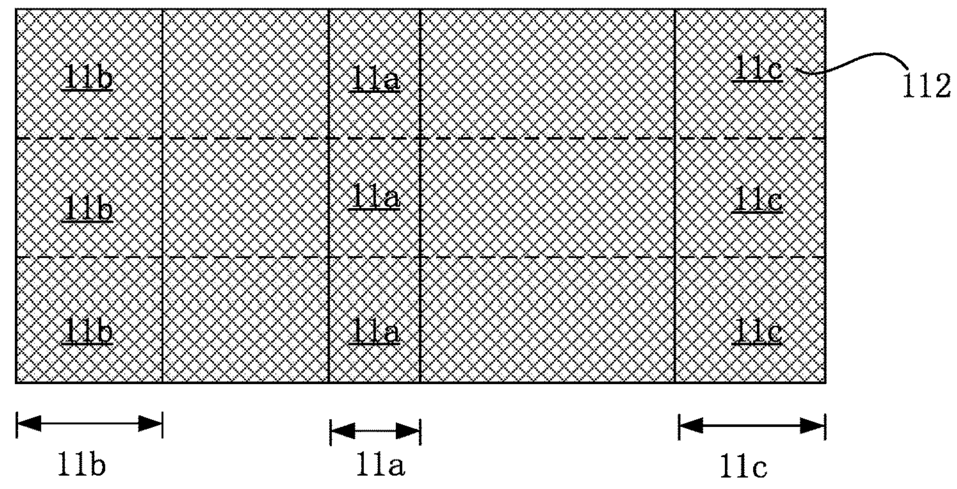
FIGS. 3 to 11 are schematic diagrams of intermediate structures corresponding to processes in FIG. 2.
Figure 4:
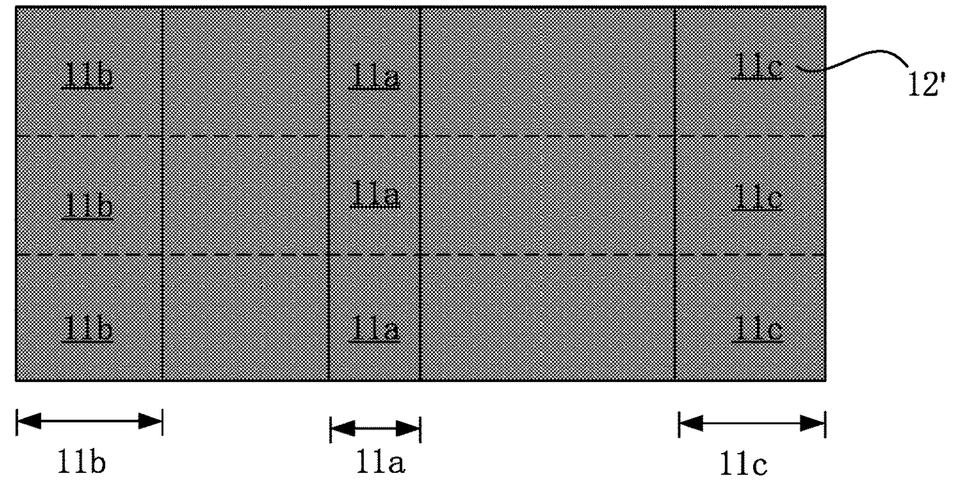
Figure 5:
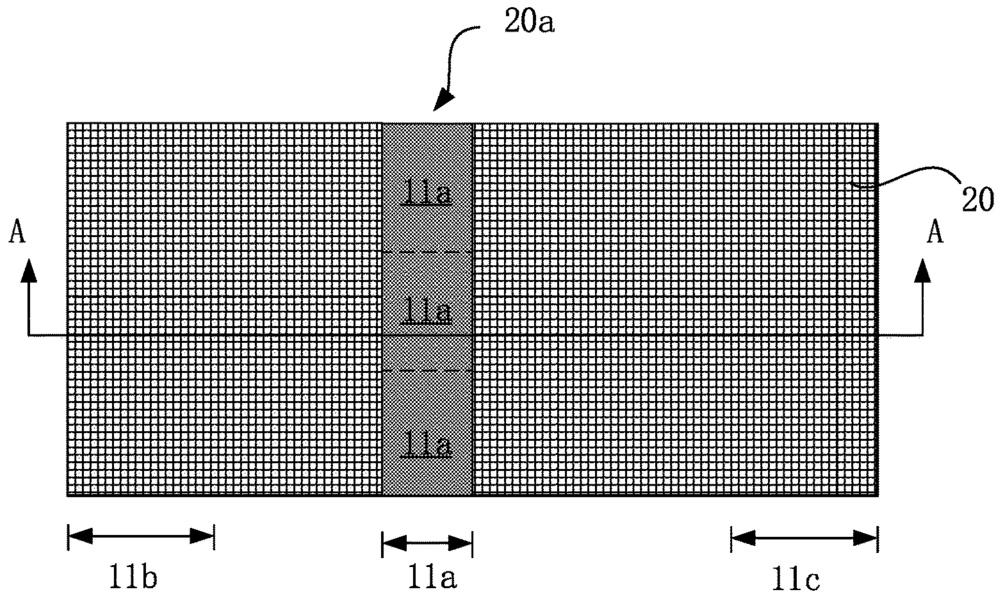
Figure 6:
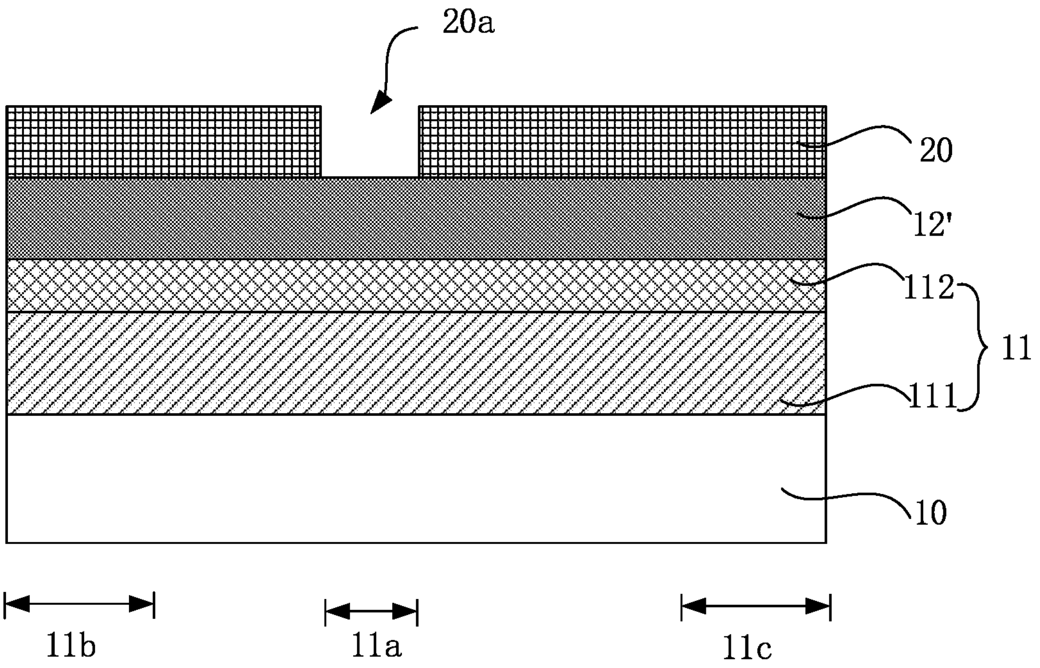
Figure 7:
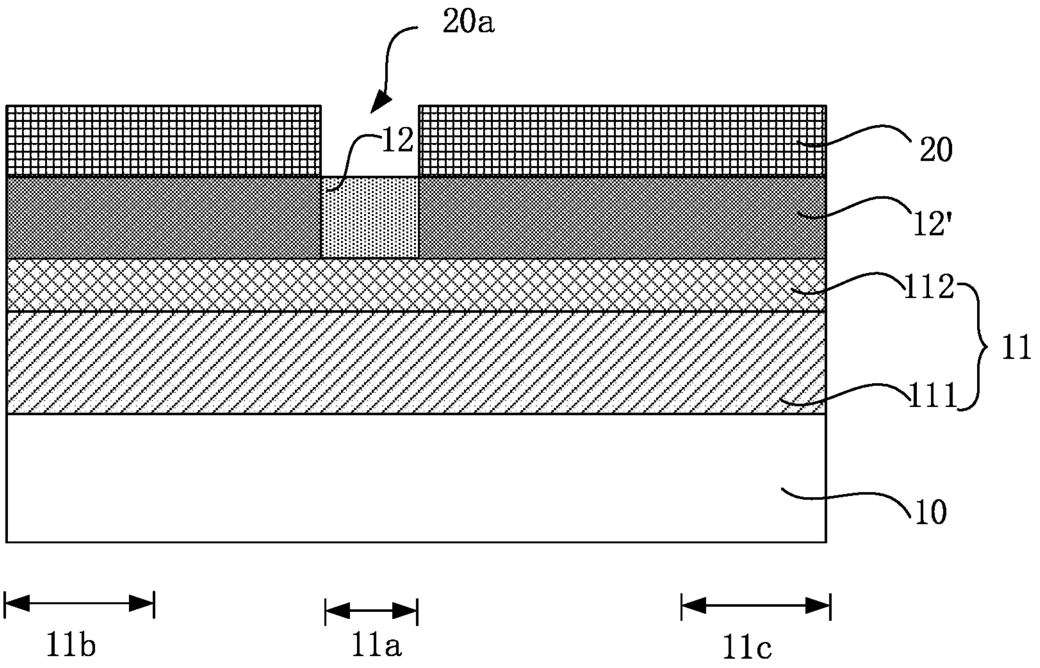

First, referring to step S1 in FIG. 2, as shown in FIGS. 3 to 8, a substrate 10 is provided, and a heterojunction structure 11 is provided on the substrate 10, and the heterojunction structure 11 includes a gate region 11*a*, and a source region 11*b* and a drain region 11*c* located on both sides of the gate region 11*a*; and a P-type semiconductor layer 12 is formed on the gate region 11*a*. FIG. 3 is a top view of the substrate and heterojunction structure; in FIG. 4, an ion doped layer is added on the basis of FIG. 3; in FIG. 5, a patterned mask layer is added on the basis of FIG. 4; FIG. 6 is a cross-sectional view along line AA in FIG. 5; FIG. 7 is a schematic diagram of a structure after the doping ions in the ion doped layer on the gate region in FIG. 6 are activated; and in FIG. 8, the patterned mask layer and the ion doped layer are removed on the basis of FIG. 7.

A material of the substrate 10 may include sapphire, silicon carbide, silicon, or diamond.

Referring to FIG. 6, the heterojunction structure 11 includes a channel layer 111 close to the substrate 10 and a barrier layer 112 away from the substrate 10. An interface between the channel layer 111 and the barrier layer 112 may form two-dimensional electron gas.

Materials of both the channel layer 111 and the barrier layer 112 may be GaN-based materials, and a band gap of the barrier layer 112 is greater than a band gap of the channel layer 111. The material of the barrier layer 112 may be AlGaN, and the material of the channel layer 111 may be GaN.

In this embodiment, referring to FIGS. 3 to 5, when manufactured, a plurality of gate regions 11*a* are connected together, a plurality of source regions 11*b* are connected together, and a plurality of drain regions 11*c* are connected together, in order to simultaneously manufacturing a plurality of HEMT devices 1. In other words, a HEMT device 1 includes a gate region 11*a*, a source region 11*b* and a drain region 11*c*.

In other embodiments, when manufactured, the heterojunction structure 11 may also include a gate region 11*a*, a source region 11*b* and a drain region 11*c*.

In an optional embodiment, the steps of forming the P-type semiconductor layer 12 may include: steps S11 to S13.

Step S11: referring to FIGS. 3 to 6, an ion doped layer 12' is formed on an entire surface of the heterojunction structure 11, and a patterned mask layer 20 is provided on the ion doped layer 12', where the patterned mask layer 20 includes a window 20*a* for exposing the gate region 11*a*.

A material of the ion doping layer 12' may be a GaN-based material. A dopant element in the ion doped layer 12' may include at least one of Mg, Zn, Ca, Sr or Ba.

A material of the patterned mask layer 20 may be silicon nitride or silicon dioxide. The patterned mask layer 20 can be achieved by dry etching or wet etching.

Step S12: referring to FIG. 6 and FIG. 7, the ion doped layer 12' is annealed to activate doped ions in the ion doped layer 12' on the gate region 11*a* to form the P-type semiconductor layer 12.

In step S12, the window 20*a* can provide an escape path for the released H atoms to activate the doped ions, because: when growing P-type GaN-based materials by MOCVD (Metal-Organic Chemical Vapor Deposition) technique, a large number of H atoms are present in the MOCVD growth environment, and if these H atoms are not removed, an acceptor dopant in the GaN-based materials, such as Mg, will be passivated by the large number of H atoms without producing holes.

For the ion doped layer 12' covered by the patterned mask layer 20, the H atoms therein cannot escape and thus the doped ions are not activated to produce holes and thus a P-type semiconductor layer 12 cannot be formed.

When manufactured, if a plurality of gate regions 11*a* of the heterojunction structure 11 are connected together, a plurality of source regions 11*b* are connected together, and a plurality of drain regions 11*c* are connected together, each P-type semiconductor layer 12 on each gate region 11*a* is connected together.

Figure 8:
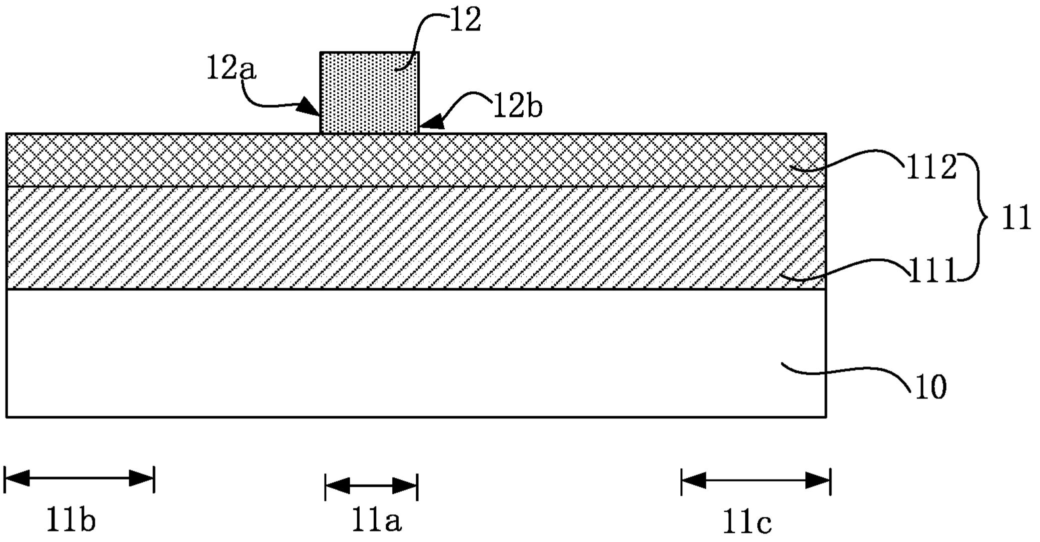

Step S13: as shown in FIG. 7 and FIG. 8, the patterned mask layer 20 and the ion doped layer 12' are removed by dry etching or wet etching.

In other embodiments, after forming the ion doped layer 12' on the heterojunction structure 11, the P-type semiconductor layer 12 may also be formed without forming the mask layer 20, but by activating the doped ions on the whole surface of the ion doped layer 12": then, the P-type semiconductor layer 12 other than the gate region 11*a* is removed by etching.

Figure 9:
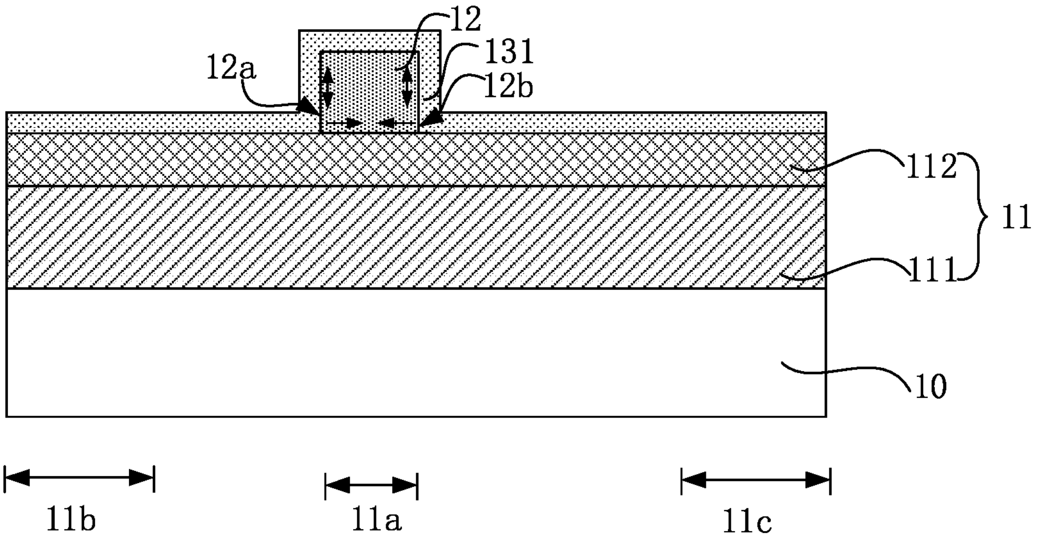
Figure 10:
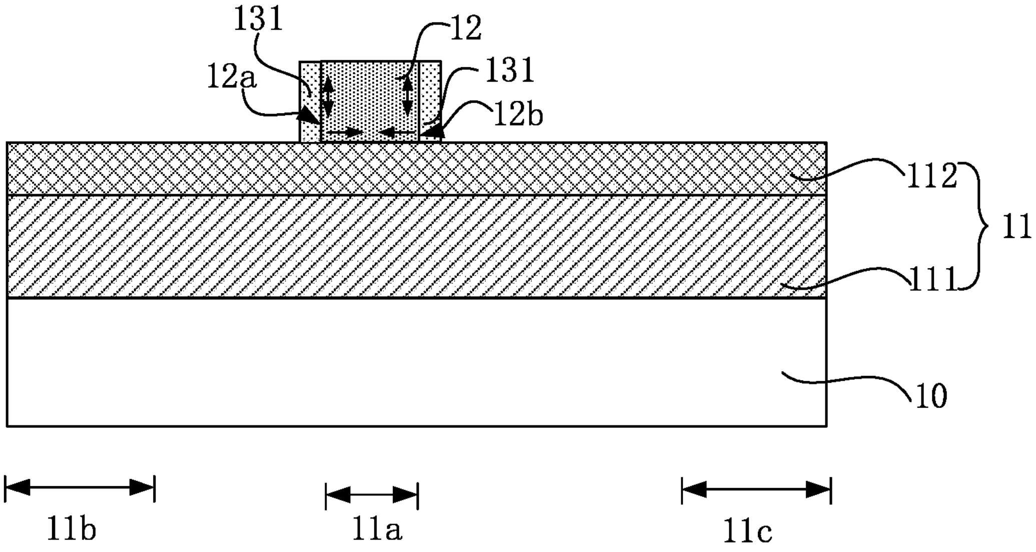

Next, referring to step S2 in FIG. 2, and as shown in FIG. 9 and FIG. 10, a first stress layer 131 is formed on two opposite sidewalls of the P-type semiconductor layer 12, and the first stress layer 131 applies a compressive stress to the P-type semiconductor layer 12 in the direction parallel to the plane in which the substrate 10 is located and a tensile stress to the P-type semiconductor layer 12 in the direction perpendicular to the plane in which the substrate 10 is located.

In this embodiment, referring to FIG. 9, the P-type semiconductor layer 12 includes a first sidewall 12*a* close to the source region 11*b* and a second sidewall 12*b* close to the drain region 11*c*.

Steps of forming the first stress layer 131 may include step S21 to S22.

Step S21: referring to FIG. 9, the first stress layer 131 is epitaxially grown on an entire surface of the P-type semiconductor layer 12 and the heterojunction structure 11.

A material of the first stress layer 131 can be silicon nitride, diamond-like carbon or P-type diamond-like carbon. Gas introduced during the epitaxial growth of each material can be selected according to the needs. For example, when silicon nitride is formed by plasma enhanced chemical vapor deposition, the gas introduced includes silane, ammonia and nitrogen, and a high frequency power source and a low frequency power source are both provided to introduce high energy particle bombardment (high energy particle bombardment can cause atoms/ions to combine or redistribute, so that the silicon nitride film stretches/expands, or becomes denser to generate intrinsic compressive stress), or a duty cycle of the low frequency power source is high and/or a duty cycle of the high frequency power source is high, or low reaction gas pressure is used, or low silane concentration (that is, the proportion of silicon element in silicon nitride is reduced) is used, etc.

Step S22: referring to FIG. 10, the first stress layer 131 on regions other than the first sidewall 12*a* and the second sidewall 12*b* of the P-type semiconductor layer 12 is removed by dry etching or wet etching.

When manufactured, if the P-type semiconductor layers 12 on the gate regions 11*a* are connected together, the first stress layers 131 on the first sidewalls 12*a* of the P-type semiconductor layers 12 are connected together, and the first stress layers 131 on the second sidewalls 12*b* of the P-type semiconductor layers 12 are connected together.

In other embodiments, the first stress layer 131 on the heterojunction structure 11 between the source region 11*b* and the P-type semiconductor layer 12, and between the drain region 11*c* and the P-type semiconductor layer 12 may also be retained to act as a passivation laver.

In other embodiments, a plurality of gate regions 11*a* may also not be connected together, and the P-type semiconductor layers 12 are not connected together after step S13. The plurality of gate regions 11*a* not connected together may be achieved by providing a plurality of windows 20*a* in the patterned mask layer 20, and each window 20*a* exposes one gate region 11*a*. In this way, the first stress layer 131 formed in step S2 is located not only on the first sidewall 12*a* and the second sidewall 12*b*, but also on the two opposite sidewalls connecting the first sidewall 12*a* and the second sidewall 12*b*.

After that, referring to step S3 in FIG. 2 and as shown in FIG. 1, the gate 14, the source 15 and the drain 16 are formed respectively, where the gate 14 is on the P-type semiconductor layer 12, the source 15 is on the source region 11*b*, and the drain 16 is on the drain region 11*c*.

Materials of gate 14, source 15 and drain 16 can be metals, such as Ti/Al/Ni/Au, Ni/Au, etc., and can be formed by physical vapor deposition or chemical vapor deposition. Schottky contact may be formed between the gate 14 and the P-type semiconductor layer 12, and ohmic contact may be formed between the source 15 and the source region 11*b*, and between the drain 16 and the drain region 11*c*.

In this embodiment, both the source 15 and the drain 16 contact the barrier layer 112. In other embodiments, the source 15 and the drain 16 may also both contact the channel layer 111.

Figure 11:
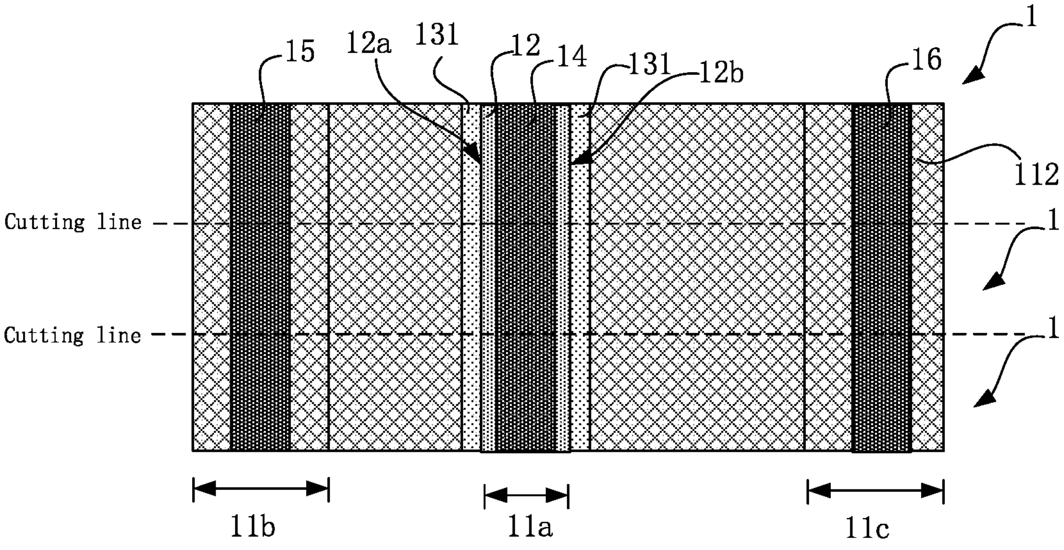

When manufactured, if a plurality of gate regions 11*a* of the heterojunction structure 11 are connected together, a plurality of source regions 11*b* of the heterojunction structure 11 are connected together, and a plurality of drain regions 11*c* of the heterojunction structure 11 are connected together, the manufacturing method further includes: as shown in FIG. 11, cutting, along a cut line, the substrate 10, such that the heterojunction structure 11 (including a plurality of gate regions 11*a* connected together, a plurality of source regions 11*b* connected together, and a plurality of drain regions 11*c* connected together), a plurality of P-type semiconductor layers 12 connected together, a first stress layer 131 connected together, a plurality of gates 14 connected together, a plurality of sources 15 connected together, and a plurality of drains 16 connected together, form a plurality of HEMT devices 1.

Figure 12:
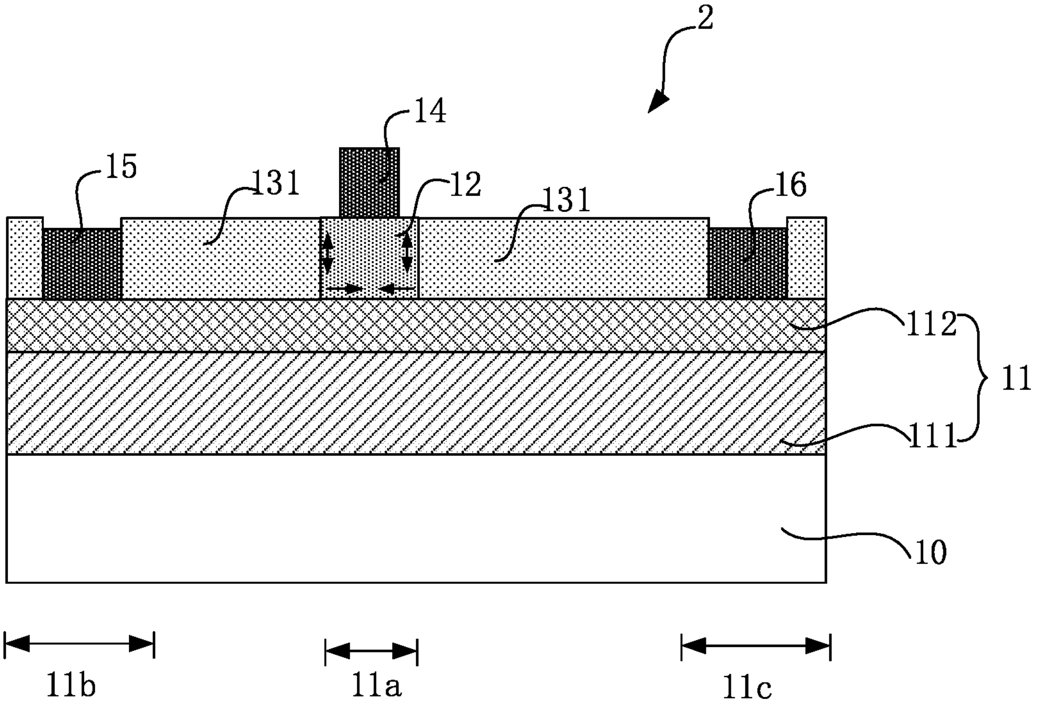
FIG. 12 is a schematic cross-sectional structure diagram of a HEMT device according to a second embodiment of the present disclosure.

FIG. 12 is a schematic cross-sectional structure diagram of a HEMT device according to a second embodiment of the present disclosure. Referring to FIG. 12, the HEMT device 2 according to the second embodiment differs from the HEMT device 1 according to the first embodiment in that: the first stress layer 131 fills up the gap between the P-type semiconductor layer 12 and the source 15, and the gap between the P-type semiconductor layer 12 and the drain 16.

Except for the above differences, other structures of the HEMT device 2 according to the second embodiment can refer to the corresponding structure of the HEMT device 1 according to the first embodiment.

Accordingly, the difference between the manufacturing method of the HEMT device 2 according to the second embodiment and the manufacturing method of the HEMT device 1 according to the first embodiment is that: the step S22 is omitted, and in addition, the source 15 and the drain 16 in step S3 are formed within the first stress layer 131.

Except for the above differences, the other steps of the manufacturing method of the HEMT device 2 according to the second embodiment can refer to the corresponding steps of the manufacturing method of the HEMT device 1 according to the first embodiment.

Figure 13:
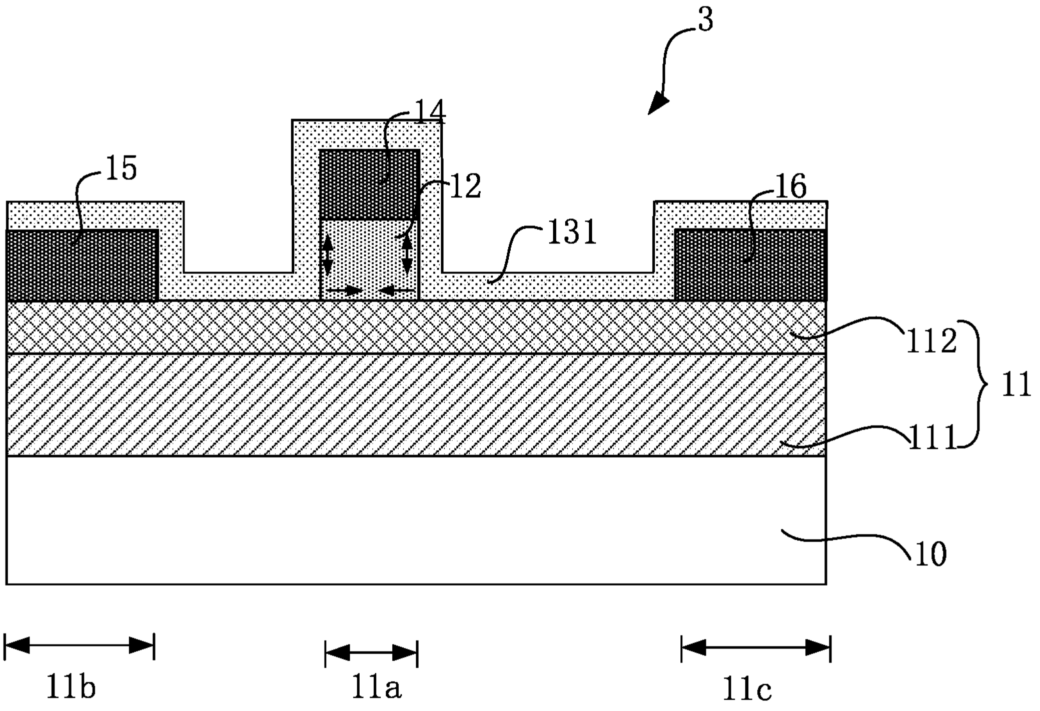
FIG. 13 is a schematic cross-sectional structure diagram of a HEMT device according to a third embodiment of the present disclosure.

FIG. 13 is a schematic diagram of the cross-sectional structure of the HEMT device of the third embodiment of the present disclosure. Referring to FIG. 13, the HEMT device 3 according to the third embodiment differs from the HEMT device 1 according to the first embodiment in that: the first stress layer 131 entirely covers the source 15, the heterojunction structure 11 between the source 15 and the gate 14, the gate 14, the heterojunction structure 11 between the gate 14 and the drain 16, and the drain 16.

When the HEMT device 3 is externally connected, windows can be formed within the first stress layer 131 to respectively expose the source 15, the gate 14 and the drain 16.

Except for the above differences, other structures of the HEMT device 3 according to the third embodiment can refer to the corresponding structure of the HEMT device 1 according to the first embodiment.

Accordingly, the difference between the manufacturing method of the HEMT device 3 according to the third embodiment and the manufacturing method of the HEMT device 1 according to the first embodiment is that the step S3 is performed first to form the gate 14 on the P-type semiconductor layer 12, the source 15 on the source region 11*b*, and the drain 16 on the drain region 11*c*; and then the step S2 is performed to entirely form the first stress layer 131 on the source 15, the heterojunction structure 11 between the source 15 and the gate 14, the gate 14, the heterojunction structure 11 between the gate 14 and the drain 16, and the drain 16.

Except for the above differences, the other steps of the manufacturing method of the HEMT device 3 according to the third embodiment can refer to the corresponding steps of the manufacturing method of the HEMT device 1 according to the first embodiment.

Figure 14:
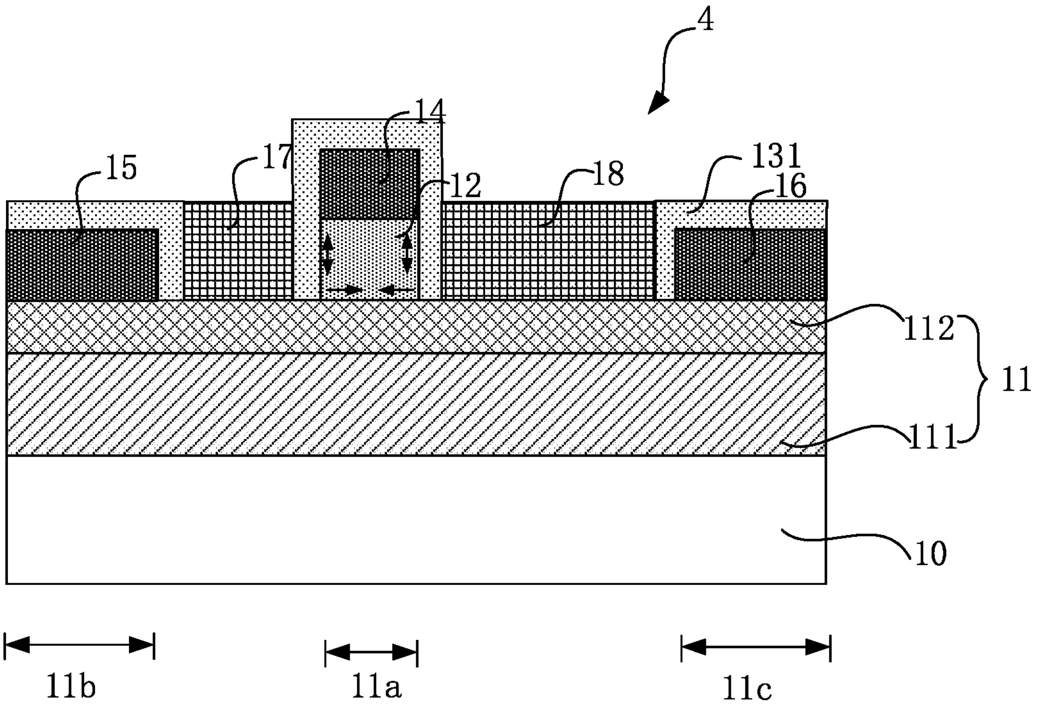
FIG. 14 is a schematic cross-sectional structure diagram of a HEMT device according to a fourth embodiment of the present disclosure.

FIG. 14 is a schematic diagram of the cross-sectional structure of the HEMT device of the fourth embodiment of the present disclosure. Referring to FIG. 14, the HEMT device 4 according to the fourth embodiment differs from the HEMT device 2 and 3 according to the second and third embodiment in that: the first stress layer 131 between the source 15 and the gate 14 includes a first opening for exposing the heterojunction structure 11; a first GaN-based epitaxial layer 17 is provided within the first opening, where the first GaN-based epitaxial layer 17 applies compressive stress to the P-type semiconductor layer 12 in the direction parallel to the plane in which the substrate 10 is located and tensile stress to the P-type semiconductor layer 12 in the direction perpendicular to the plane in which the substrate 10 is located; the first stress layer 131 between the drain 16 and the gate 14 includes a second opening for exposing the heterojunction structure 11; and a second GaN-based epitaxial layer 18 is provided within the second opening, where the second GaN-based epitaxial layer 18 applies compressive stress to the P-type semiconductor layer 12 in the direction parallel to the plane in which the substrate 10 is located and tensile stress to the P-type semiconductor layer 12 in the direction perpendicular to the plane in which the substrate 10 is located.

Materials of the first GaN-based epitaxial layer 17 and the second GaN-based epitaxial layer 18 may be InGaN.

Since the InGaN material epitaxially grown on the first sidewall 12*a* and the second sidewall 12*b* is a c-axis InGaN material, the c-axis InGaN material is a uniaxial compressive stress material. Since lattices of the first GaN-based epitaxial layer 17 and the second GaN-based epitaxial layer 18 do not match with a lattice of the P-type semiconductor layer 12, the first GaN-based epitaxial layer 17 and the second GaN-based epitaxial layer 18 can apply compressive stress to the P-type semiconductor layer 12 in the direction parallel to the plane in which the substrate 10 is located and tensile stress to the P-type semiconductor layer 12 in the direction perpendicular to the plane in which the substrate 10 is located.

Except for the above differences, other structures of the HEMT device 4 according to the fourth embodiment can refer to the corresponding structure of the HEMT device 2 and 3 according to the second and third embodiment.

Accordingly, the difference between the manufacturing method of the HEMT device 4 according to the fourth embodiment and the manufacturing method of the HEMT device 2 and 3 according to the second and third embodiment is that: in strep S2, after the first stress layer 131 is formed, the method further includes that: a first opening is formed within the first stress layer 131 between the source 15 and the gate 14 to expose the heterojunction structure 11, a first GaN-based epitaxial layer 17 is epitaxially grown within the first opening, where the first GaN-based epitaxial layer 17 applies compressive stress to the P-type semiconductor layer 12 in the direction parallel to the plane in which the substrate 10 is located and tensile stress to the P-type semiconductor layer 12 in the direction perpendicular to the plane in which the substrate 10 is located; and a second opening is formed within the first stress layer 131 between the drain 16 and the gate 14 to expose the heterojunction structure 11, a second GaN-based epitaxial layer 18 is epitaxially grown within the second opening, where the second GaN-based epitaxial layer 18 applies compressive stress to the P-type semiconductor layer 12 in the direction parallel to the plane in which the substrate 10 is located and tensile stress to the P-type semiconductor layer 12 in the direction perpendicular to the plane in which the substrate 10 is located.

The first opening and the second opening can be realized by dry etching and can be formed in the same process. The first GaN-based epitaxial layer 17 and the second GaN-based epitaxial layer 18 can be formed by epitaxial growth in the same process.

Except for the above differences, the other steps of the manufacturing method of the HEMT device 4 according to the fourth embodiment can refer to the corresponding steps of the manufacturing method of the HEMT device 2 and 3 according to the second and third embodiment.

Figure 15:
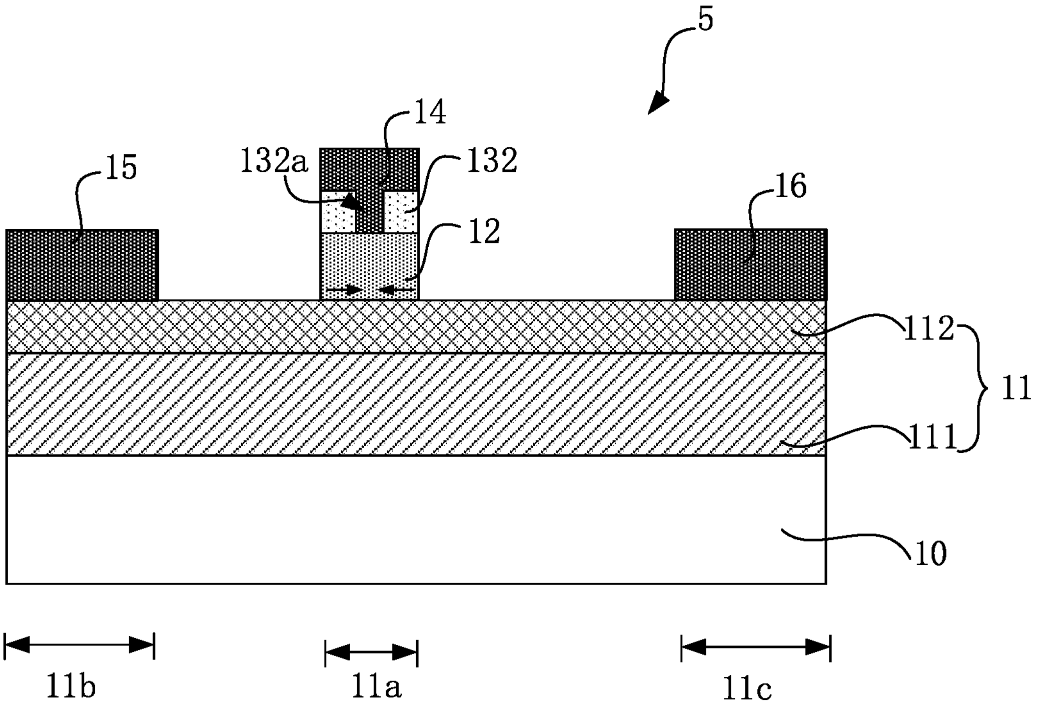
FIG. 15 is a schematic cross-sectional structure diagram of a HEMT device according to a fifth embodiment of the present disclosure.

FIG. 15 is a schematic diagram of the cross-sectional structure of the HEMT device of the fifth embodiment of the present disclosure. Referring to FIG. 15, the HEMT device 5 according to the fifth embodiment differs from the HEMT device 1 according to the first embodiment in that: the first stress layer 131 is omitted, a second stress layer 132 is provided on the top wall of the P-type semiconductor layer 12, where the second stress layer 132 applies compressive stress to the P-type semiconductor layer 12 in the direction parallel to the plane in which the substrate 10 is located: the second stress layer 132 includes a third opening 132*a* exposing the P-type semiconductor layer 12, and the gate 14 is located in the third opening 132*a* and on the second stress layer 132.

A material of the second stress layer 132 may be silicon nitride, diamond-like carbon (DLC) or P-type diamond-like carbon (P-DLC).

Taking the material of the second stress layer 132 as silicon nitride as an example, by controlling the silicon nitride film to have more cavities or defects inside the silicon nitride film, and since the silicon nitride film molecules near the cavities or defects inside the silicon nitride film maintain the shape of the silicon nitride film with mutual gravitational force, the silicon nitride film exhibits intrinsic tensile stress, which in turn can apply compressive stress to the P-type semiconductor layer 12 in the direction parallel to the plane where the substrate 10 is located.

Diamond-like carbon (DLC) and P-type diamond-like carbon (PDLC) apply stress on the P-type semiconductor layer 12 in a similar principle to that of the silicon nitride film.

Except for the above differences, other structures of the HEMT device 5 according to the fifth embodiment can refer to the corresponding structure of the HEMT device 1 according to the first embodiment.

Accordingly, the difference between the manufacturing method of the HEMT device 5 according to the fifth embodiment and the manufacturing method of the HEMT device 1 according to the first embodiment is that in step S2, a second stress layer 132 is formed on the top wall of the P-type semiconductor layer 12, where the second stress layer 132 applies a compressive stress to the P-type semiconductor layer 12 in the direction parallel to the plane in which the substrate 10 is located.

Steps of forming the second stress layer 132 may include steps S21' to S22'.

Step S21': the second stress layer 132 is entirely epitaxially grown on the P-type semiconductor layer 12 and the heterojunction structure 11.

Epitaxial growth process parameters of the second stress layer 132 are different from epitaxial growth process parameters of the first stress layer 131, thereby enabling the transition from intrinsic compressive stress film to intrinsic tensile stress film for manufacturing. A material of the second stress layer 132 can be silicon nitride, diamond-like carbon or P-type diamond-like carbon. Gas introduced for the epitaxial growth of each material can be selected as desired, for example, when silicon nitride is formed by plasma-enhanced chemical vapor deposition, gases introduced includes silane, ammonia and nitrogen, and only a high frequency power source is applied, or a high reaction gas pressure is used, etc.

Step S22': the second stress layer 132 on the region other than the top wall of the P-type semiconductor layer 12 is removed by dry etching or wet etching.

In this embodiment, step S13 can be omitted, in other words, the HEMT device 5 can retain the patterned mask layer 20 as well as the remaining ion doped layer 12'. When the material of the patterned mask layer 20 is silicon nitride, a compressive stress can be applied to the P-type semiconductor layer 12 in the direction parallel to the plane in which the substrate 10 is located.

Except for the above differences, the other steps of the manufacturing method of the HEMT device 5 according to the fifth embodiment can refer to the corresponding steps of the manufacturing method of the HEMT device 1 according to the first embodiment.

Figure 16:
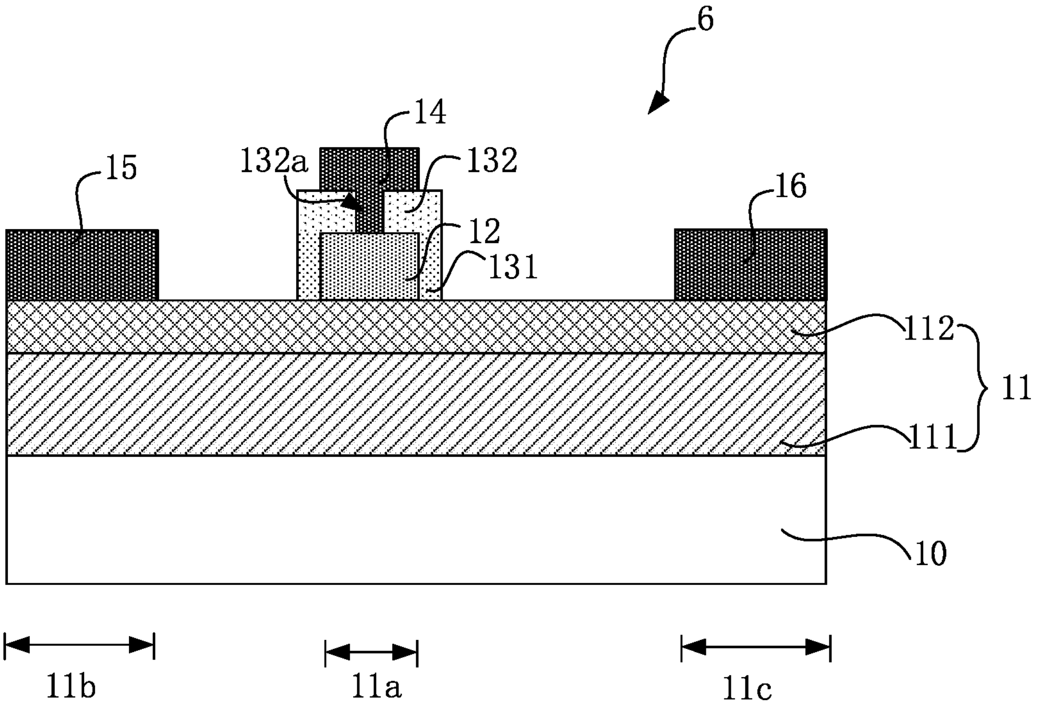
FIG. 16 is a schematic cross-sectional structure diagram of a HEMT device according to a sixth embodiment of the present disclosure.

FIG. 16 is a schematic diagram of the cross-sectional structure of the HEMT device of the sixth embodiment of the present disclosure. Referring to FIG. 16, the HEMT device 6 according to the sixth embodiment differs from the HEMT device 1 according to the first embodiment in that: a second stress layer 132 is provided on the top wall of the P-type semiconductor layer 12, where the second stress layer 132 applies compressive stress to the P-type semiconductor layer 12 in the direction parallel to the plane in which the substrate 10 is located: the second stress layer 132 includes a third opening 132*a* for exposing the P-type semiconductor layer 12, and the gate 14 is located in the third opening 132*a* and on the second stress layer 132.

A material of the second stress layer 132 may be silicon nitride, diamond-like carbon (DLC) or P-type diamond-like carbon (P-DLC).

Except for the above differences, other structures of the HEMT device 6 according to the sixth embodiment can refer to the corresponding structure of the HEMT device 1 according to the first embodiment.

Accordingly, the difference between the manufacturing method of the HEMT device 6, according to the sixth embodiment and the manufacturing method of the HEMT device 1 according to the first embodiment is that in step S2, after the step of forming the first stress layer 131 on the two opposite sidewalls of the P-type semiconductor layer 12, a second stress layer 132 is continued to be formed on the top wall of the P-type semiconductor layer 12, where the second stress layer 132 applies compressive stress to the P-type semiconductor layer 12 in the direction parallel to the plane in which the substrate 10 is located, and the epitaxial growth process parameters of the second stress layer 132 are different from the epitaxial growth process parameters of the first stress layer 131.

Epitaxial growth process parameters of the second stress layer 132 may be changed to make the epitaxial growth process parameters of the second stress layer 132 different from epitaxial growth process parameters of the first stress layer 131, thereby enabling the transition from intrinsic compressive stress film to intrinsic tensile stress film for manufacturing. For example, after forming the first stress layer 131 by plasma-enhanced chemical vapor deposition, the low-frequency power source is turned off and only a high-frequency power source is applied, or a low-frequency power source and a high-frequency power source are both provided, but the duty cycle of the low frequency power source and/or the duty cycle of high frequency power source is reduced, or the reaction gas pressure is increased, etc.

The first stress layer 131 and the second stress layer 132 that are epitaxially grown can be connected together or separated from each other.

Except for the above differences, the other steps of the manufacturing method of the HEMT device 6 according to the sixth embodiment can refer to the corresponding steps of the manufacturing method of the HEMT device 1 according to the first embodiment.

Figure 17:
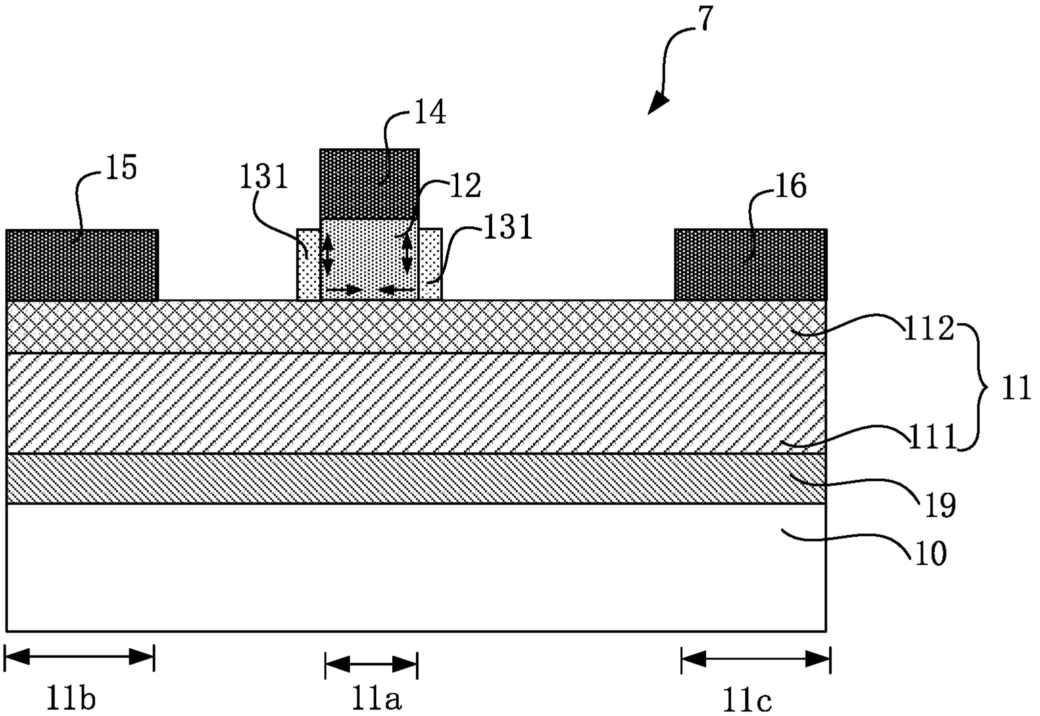
FIG. 17 is a schematic cross-sectional structure diagram of a HEMT device according to a seventh embodiment of the present disclosure.

FIG. 17 is a schematic cross-sectional structure diagram of a HEMT device according to a seventh embodiment of the present disclosure. Referring to FIG. 17, the HEMT device 7 according to the seventh embodiment differs from the HEMT devices 1, 2, 3, 4, 5, and 6 according to the first to sixth embodiments in that: a compressive stress layer 19 is provided between the substrate 10 and the heterojunction structure 11 for applying compressive stress to the P-type semiconductor layer 12 in the direction parallel to the plane of the substrate 10.

A material of the compressive stress layer is $Al_xIn_yGa_{1-x-y}N$, which can apply compressive stress to the P-type semiconductor layer 12 in the direction parallel to the plane in which the substrate 10 is located.

Except for the above differences, other structures of the HEMT device 7 according to the seventh embodiment can refer to the corresponding structure of the HEMT devices 1, 2, 3, 4, 5, and 6 according to the first to sixth embodiments.

Correspondingly, a manufacturing method of the HEMT device 7 according to the seventh embodiment differs from the manufacturing methods of the HEMT devices 1, 2, 3, 4, 5, and 6 according to the first to sixth embodiments in that: in step S1, a compressive stress layer 19 is provided between the substrate 10 and the heterojunction structure 11 for applying compressive stress to the P-type semiconductor layer 12 in the direction parallel to the plane of the substrate 10.

Except for the above differences, the other steps of the manufacturing method of the HEMT device 7 according to the seventh embodiment can refer to the corresponding steps of the manufacturing method of the HEMT devices 1, 2, 3, 4, 5, and 6 according to the first to sixth embodiments.

Figure 18:
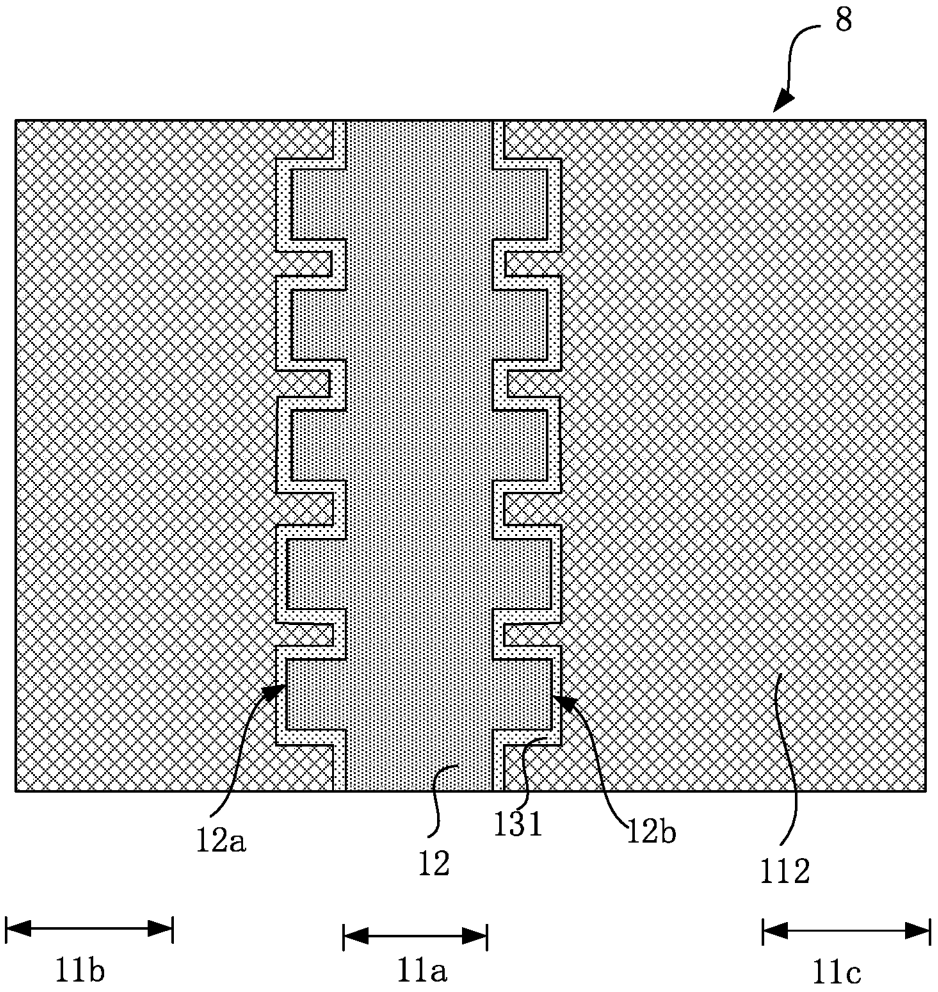
FIG. 18 is a schematic top-view structure diagram of a HEMT device of an eighth embodiment of the present disclosure: where, a source, a gate and a drain are omitted.

FIG. 18 is a schematic top-view structure diagram of a HEMT device of an eighth embodiment of the present disclosure: where, a source, a gate and a drain are omitted. Referring to FIG. 18, the HEMT device 8 according to the eighth embodiment differs from the HEMT devices 1, 2, 3, 4, 5, 6, and 7 according to the first to seventh embodiments in that: the P-type semiconductor layer 12 includes a cross-section that is parallel to the plane in which the substrate 10 is located; and the cross-section of the first sidewall 12*a* of the P-type semiconductor layer 12 is zigzag, and the cross-section of the second sidewall 12*b* of the P-type semiconductor layer 12 is zigzag.

The cross-section of the first sidewall 12*a* of the P-type semiconductor layer 12 may also be wavy or curved, and the cross-section of the second sidewall 12*b* may also be wavy or curved.

The wavy, curved or zigzag shape can increase the area of the force applied by the first stress layer 131 to the P-type semiconductor layer 12 relative to the linear shape, thereby increasing the hole concentration of the P-type semiconductor layer 12.

The cross-section of the first sidewall 12*a* and the cross-section of the second sidewall 12*b* may have the same shape or different shapes.

Except for the above differences, other structures of the HEMT device 8 according to the eighth embodiment can refer to the corresponding structure of the HEMT devices 1, 2, 3, 4, 5, 6 and 7 according to the first to seventh embodiments.

Accordingly, the manufacturing method of the HEMT device 8 according to the eighth embodiment differs from the manufacturing methods of the HEMT devices 1, 2, 3, 4, 5, 6, and 7 according to the first to seventh embodiments in that: in step S1, the cross-section of the first sidewall 12*a* of the formed P-type semiconductor layer 12 is wavy, curved or zigzag, and the cross-section of the second sidewall 12*b* is wavy, curved or zigzag.

Except for the above differences, the other steps of the manufacturing method of the HEMT device 8 according to the eighth embodiment can refer to the corresponding steps of the manufacturing method of the HEMT devices 1, 2, 3, 4, 5, 6 and 7 according to the first to seventh embodiments.

Although the present disclosure is disclosed as above, the present disclosure is not limited thereto. Any person skilled in the art can make various changes and modifications without departing from the spirit and scope of the present disclosure, and therefore the scope of protection of the present disclosure shall be subject to the scope defined by the claims.

The invention claimed is:

1. A HEMT device, comprising:

a substrate;

a heterojunction structure on the substrate, wherein the heterojunction structure comprises a gate region, and a source region and a drain region located on both sides of the gate region;

a P-type semiconductor layer on the gate region;

at least one of a first stress layer or a second stress layer, wherein the first stress layer is located on two opposite sidewalls of the P-type semiconductor layer for applying a first compressive stress to the P-type semiconductor layer parallel to a plane in which the substrate is located and a first tensile stress to the P-type semiconductor layer perpendicular to the plane in which the substrate is located; and the second stress layer is located on a top wall of the P-type semiconductor layer for applying a second compressive stress to the P-type semiconductor layer parallel to the plane in which the substrate is located; and a gate, a source and a drain, wherein the gate is connected to the P-type semiconductor layer, the source is located on the source region, and the drain is located on the drain region.

2. The HEMT device according to claim 1, wherein a material of at least one of the first stress layer or the second stress layer is silicon nitride, diamond-like carbon or P-type diamond-like carbon.

3. The HEMT device according to claim 1, wherein the P-type semiconductor layer comprises a first sidewall of the two opposite sidewalls that is close to the source region and a second sidewall of the two opposite sidewalls that is close to the drain region, and the first stress layer is located on the first sidewall and the second sidewall of the P-type semiconductor layer.

4. The HEMT device according to claim 3, wherein the first stress layer fills up or does not fill up at least one of:

a gap between the P-type semiconductor layer and the source, or a gap between the P-type semiconductor layer and the drain.

5. The HEMT device according to claim 4, wherein the first stress layer covers on the source, the heterojunction structure between the source and the gate, the gate, the heterojunction structure between the gate and the drain, and the drain.

6. The HEMT device according to claim 4, wherein the first stress layer between the source and the gate comprises a first opening for exposing the heterojunction structure, a first GaN-based epitaxial layer is located in the first opening, and the first GaN-based epitaxial layer applies a third compressive stress to the P-type semiconductor layer parallel to the plane in which the substrate is located and a second tensile stress to the P-type semiconductor layer perpendicular to the plane in which the substrate is located; and the first stress layer between the drain and the gate comprises a second opening for exposing the heterojunction structure, a second GaN-based epitaxial layer is in the second opening, and the second GaN-based epitaxial layer applies a fourth compressive stress to the P-type semiconductor layer parallel to the plane in which the substrate is located and a third tensile stress to the P-type semiconductor layer perpendicular to the plane in which the substrate is located.

7. The HEMT device according to claim 6, wherein materials of the first GaN-based epitaxial layer and the second GaN-based epitaxial layer is InGaN.

8. The HEMT device according to claim 3, wherein the P-type semiconductor layer comprises a cross-section parallel to the plane in which the substrate is located; and at least one of: the first sidewall of the P-type semiconductor layer comprises a wavy, curved or zigzag cross-section, or the second sidewall of the P-type semiconductor layer has a wavy, curved or zigzag cross-section.

9. The HEMT device according to claim 1, wherein the heterojunction structure comprises a channel layer close to the substrate and a barrier layer away from the substrate, and the source and the drain contact the channel layer or the barrier layer.

10. The HEMT device according to claim 1, wherein the substrate comprises a fifth compressive stress layer between the substrate and the heterojunction structure for applying a fifth compressive stress to the P-type semiconductor layer parallel to the plane in which the substrate is located.

11. The HEMT device according to claim 10, wherein a material of the compressive stress layer is $Al_xIn_yGa_{1-x-y}N$.

12. The HEMT device according to claim 1, wherein the second stress layer comprises a third opening for exposing the P-type semiconductor layer, and the gate is located in the third opening and on the second stress layer.

13. A manufacturing method of a HEMT device, comprising:

providing a substrate;

providing a heterojunction structure on the substrate, wherein the heterojunction structure comprises a gate region, and also comprises a source region and a drain region on both sides of the gate region;

forming a P-type semiconductor layer on the gate region;

forming at least one of a first stress layer on two opposite sidewalls of the P-type semiconductor layer or a second stress layer on a top wall of the P-type semiconductor layer, wherein the first stress layer is configured to apply a first compressive stress to the P-type semiconductor layer parallel to a plane in which the substrate is located and a first tensile stress to the P-type semiconductor layer perpendicular to the plane in which the substrate is located, and the second stress layer is configured to apply a second compressive stress to the P-type semiconductor layer parallel to a plane in which the substrate is located; and forming a gate, a source and a drain respectively, wherein the gate is connected to the P-type semiconductor layer, the source is located on the source region and the drain is located on the drain region.

14. The manufacturing method of a HEMT device according to claim 13, wherein a plurality of gate regions are connected together, a plurality of source regions are connected together, a plurality of drain regions are connected together, and a plurality of P-type semiconductor layers are connected together; each of the P-type semiconductor layers comprising a first sidewall of the two opposite sidewalls that is close to a source region and a second sidewall of the two opposite sidewalls that is close to a drain region, and the first stress layer is formed on the first sidewall and the second sidewall of the P-type semiconductor layer.

15. The manufacturing method of a HEMT device according to claim 13, wherein forming the first stress layer comprises:

first forming the gate, the source and the drain, and then forming the first stress layer on the source, the heterojunction structure between the source and the gate, the gate, the heterojunction structure between the gate and the drain, and the drain; or first forming the first stress layer on a top wall of the P-type semiconductor layer, sidewalls of the P-type semiconductor layer and the heterojunction structure, then removing the first stress layer on regions other than the sidewalls of the P-type semiconductor layer, and then forming the gate, the source and the drain respectively.

16. The manufacturing method of a HEMT device according to claim 15, wherein after forming the first stress layer, the manufacturing method further comprises:

forming a first opening for exposing the heterojunction structure within the first stress layer between the source and the gate;

epitaxially growing a first GaN-based epitaxial layer in the first opening, wherein the first GaN-based epitaxial layer applies a third compressive stress to the P-type semiconductor layer parallel to the plane in which the substrate is located and a second tensile stress to the P-type semiconductor layer perpendicular to the plane in which the substrate is located;

forming a second opening for exposing the heterojunction structure within the first stress layer between the drain and the gate; and epitaxially growing a second GaN-based epitaxial layer in the second opening, wherein the second GaN-based epitaxial layer applies a fourth compressive stress to the P-type semiconductor layer parallel to the plane in which the substrate is located and a third tensile stress to the P-type semiconductor layer perpendicular to the plane in which the substrate is located.

17. The manufacturing method of a HEMT device according to claim 13, wherein forming the gate comprises:

forming a second stress layer on a top wall of the P-type semiconductor layer for applying a fifth compressive stress to the P-type semiconductor layer parallel to the plane in which the substrate is located;

forming a third opening for exposing the P-type semiconductor layer in the second stress layer; and forming the gate in the third opening and on the second stress layer.

18. The manufacturing method of a HEMT devices according to claim 13, wherein the first stress layer is first epitaxially grown on the two opposite sidewalls of the P-type semiconductor layer, and the second stress layer is later epitaxially grown on the top wall of the P-type semiconductor layer, and epitaxial growth process parameters of the second stress layer are different from epitaxial growth process parameters of the first stress layer.

19. The manufacturing method of a HEMT device according to claim 18, wherein the first stress layer and the second stress layer that are epitaxially grown are connected together or separated from each other.

20. The manufacturing method of a HEMT device according to claim 13, wherein forming the P-type semiconductor layer on the gate region comprises:

forming an ion doped layer on the heterojunction structure, activating doped ions in an entire surface of the ion doped layer to form a P-type semiconductor layer, and removing the P-type semiconductor layer other than the gate region by etching; or forming an ion doped layer on an entire surface of the heterojunction structure, providing a patterned mask layer on the ion doped layer, wherein the patterned mask layer comprises a window to expose the gate region; and activating doped ions in the ion doped layer on the gate region to form the P-type semiconductor layer.

* * * * *